United States Patent [19]
Jamieson

[11] Patent Number: 5,841,358
[45] Date of Patent: Nov. 24, 1998

[54] MOTOR CURRENT STATUS SENSOR

[75] Inventor: J. Scott Jamieson, Waukesha, Wis.

[73] Assignee: Johnson Service Co., Milwaukee, Wis.

[21] Appl. No.: 903,266

[22] Filed: Jul. 25, 1997

Related U.S. Application Data

[63] Continuation of Ser. No. 755,687, Nov. 25, 1996, abandoned, which is a continuation of Ser. No. 105,272, Aug. 12, 1993, abandoned.

[51] Int. Cl.$^6$ .................................................. B60C 23/00
[52] U.S. Cl. ......................... 340/648; 340/635; 318/490; 318/772; 388/808
[58] Field of Search .................................... 340/635, 648; 318/490, 772, 777, 778; 388/806, 808, 815, 822

[56] References Cited

U.S. PATENT DOCUMENTS

| Re. 33,308 | 8/1990 | Millard et al. | 318/490 |
|---|---|---|---|
| 3,513,393 | 5/1970 | Meyers. | |
| 4,030,008 | 6/1977 | Buckle et al. | 318/772 |
| 4,558,306 | 12/1985 | Freliech | 340/648 |
| 4,737,701 | 4/1988 | Hoemann et al. | 318/772 |
| 4,762,463 | 8/1988 | Yang | 416/61 |
| 4,841,188 | 6/1989 | Hao | 318/777 |
| 5,049,801 | 9/1991 | Potter | 318/772 |
| 5,170,110 | 12/1992 | Vlasak | 318/777 |

FOREIGN PATENT DOCUMENTS

| 4032689 | 4/1992 | Germany. |
|---|---|---|

*Primary Examiner*—Daniel J. Wu
*Attorney, Agent, or Firm*—Quarles & Brady

[57] ABSTRACT

A method and circuit design for establishing the operating status of a direct drive, multiple speed motor. More specifically, the invention furnishes a method for providing feedback to an air distribution system indicating first whether the system motor is operating and second which speed winding has been selected. The circuit design senses the voltage differences between the speed windings of the motor and also between the first speed motor winding and the power supply. The voltage difference sensed by the circuit will determine whether a light emitting diode (LED) illuminates. The illumination of the LED indicates to the system controller whether the motor is operating and the speed winding that has been selected, thus providing the necessary feedback to the air distribution system controller.

8 Claims, 1 Drawing Sheet

MOTOR CURRENT STATUS SENSOR

This is a continuation of U.S. patent application Ser. No. 08/755,687 filed Nov. 25, 1996, now abandoned, which is a continuatoin of Ser. No. 08/105,272, filed Aug. 12, 1993, now abandoned.

BACKGROUND OF THE INVENTION

The present invention relates to the field of integrated function control and more particularly to the control of motors in air distribution systems, such as an HVAC or dual-firing rate furnace systems.

Most modern furnace designs involve direct drive fans for air distribution. These fans are typically designed for use at multiple speeds, allowing the user to operate the fans at varying speeds. In fact, many designs for integrated function controls directly incorporate the speed select function. One example of this type of system is the air distribution motor in an HVAC system. Another example is the two-speed inducer motor in a dual-firing rate furnace system.

There are times when proof of motor operation within these systems is necessary for a particular function to be performed. One example is the twinning module concept, where two furnaces are connected to one duct system. Because the twinning module concept operates with one duct system, it is necessary to activate the fans of both furnaces at the appropriate speed so that backflow will not occur in one of the furnaces. This does not mean that both systems must be supplying conditioned air; if only one system is needed in full operation, it is only necessary to operate the fan of the other system.

Current air distribution systems are capable of commanding both fans to operate, but the systems provide no feedback to the system controller verifying that both fans are indeed operating at the appropriate speed. The feedback to the system is necessary to prevent inefficiency in the system and also damage to the furnace caused by backflow. Backflow produces an inefficient air distribution system by redirecting the conditioned air away from the residence or building into the second furnace system. Additionally, the backflow into the second furnace system may cause the second fan to rotate backwards, causing damage to the furnace when the motor does start.

Current methods are available to provide feedback to the system controller. The first of these is through the use of direct sensing, which essentially involves the use of either photo or magnetic sensing devices to detect the movement of the blades of the fan. This method requires significant additional hardware and is therefore a very expensive addition to an air distribution system. Furthermore, the system must be designed particularly for this method; it may not be updated to include such a sensing device. This causes the direct sensing method to be both an expensive and inefficient alternative.

Another available method is current sensing, which involves the use of a current transformer and resistor to detect a certain current threshold. Like direct sensing, current sensing requires additional equipment, making it a very expensive feedback option. Additionally, because different furnaces use different motors that operate on different currents, a different circuit must be used for each current level. Like direct sensing, this method is both inefficient and expensive.

Therefore, a need exists for a method of providing feedback to the air distribution system controller of a motor. Such a method must be able to indicate that the motor is indeed operating and that it is operating at the correct speed. The method should be compatible with varying furnace designs, efficient, and inexpensive.

SUMMARY OF THE INVENTION

The broad object of this invention is to furnish a device for providing feedback to an air distribution system controller indicating first that the system motor is indeed operating, and second that the proper speed winding has been selected.

It is a further object of the invention to provide such a device that is compatible with varying furnace systems, efficient, and inexpensive.

These and other objects of the invention, which will be apparent to one skilled in the art, are accomplished by the present invention through the addition of two voltage sensing circuits. These voltage sensing circuits represent a method for establishing the operating status of a direct drive, multiple speed motor, that is, the circuits can establish whether the motor is operating and can indicate which speed winding has been selected. The method for doing so is comprised of first, sensing the voltage difference across the speed windings of the motor and also the voltage difference between the first speed winding and the power supply and second, indicating whether such voltage differences are above a predetermined threshold. It is assumed that the direct drive, multiple speed motor has at least first and second speed motor windings and a power supply.

A first voltage sensing circuit verifies whether the motor is operating by sensing the voltage difference across the speed windings of the motor and indicating whether the voltage difference is above a predetermined voltage level. This is accomplished by a resistor, a diode, and a photocoupler utilizing a light emitting diode (LED), all connected in series between the speed windings of the motor. The LED will indicate whether the motor is operating by illuminating.

A second voltage sensing circuit verifies which winding has been selected by sensing the voltage difference between the high speed motor winding and the power line and indicating whether the voltage difference is above a predetermined voltage level. This sensing and indicating is accomplished by a resistor, a diode, and a photocoupler utilizing a light emitting diode (LED), all connected in series between the first speed motor winding and the power supply. The illumination of the LED indicates that the first speed motor winding has a voltage difference from the power line and therefore is not the winding selected.

The utilization of the two voltage sensing circuits yields a device that provides feedback to an air distribution system controller indicating not only that the motor is operating, but also that the proper winding has been selected. This invention represents a device that is universal in use, efficient, and inexpensive.

DETAILED DESCRIPTION OF PREFERRED EMBODIMENTS

Figure 1:
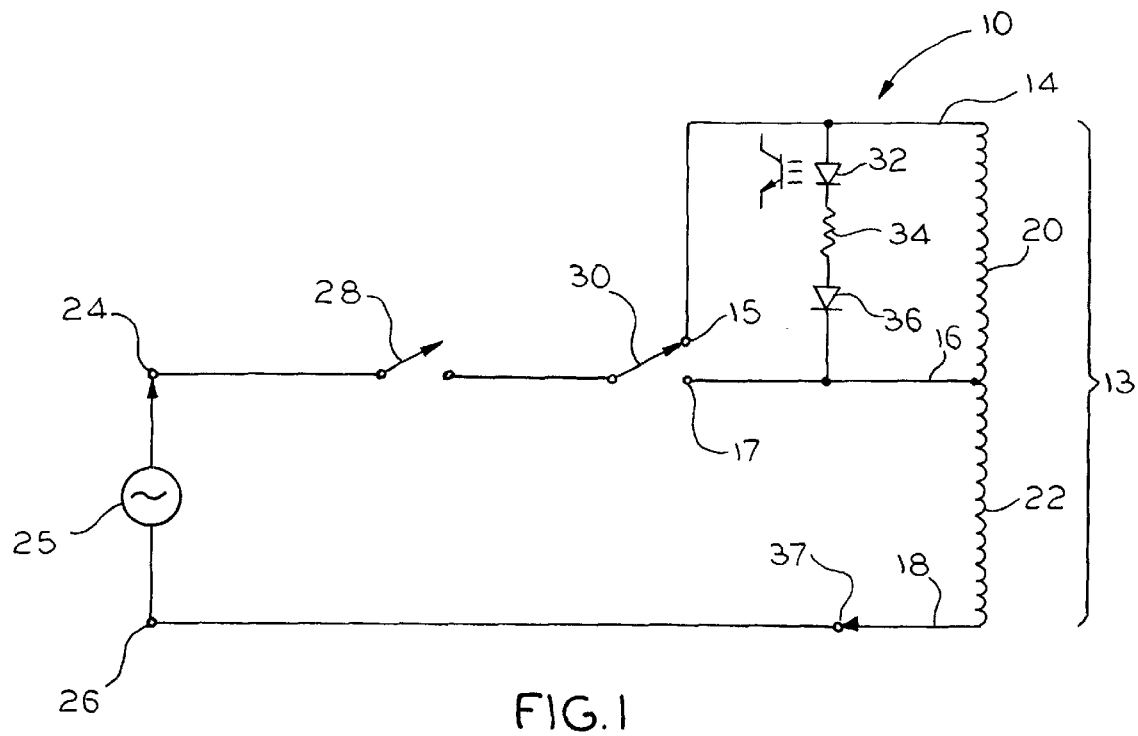
FIG. 1 is a circuit diagram schematically representing an embodiment of the invention.

Referring to FIG. 1, there is schematically illustrated a circuit arrangement 10 for establishing the basic operating status of a direct drive, multiple speed (DDMS) motor according to the preferred exemplary embodiment of the invention. The circuit arrangement in FIG. 1 is a part of a larger air distribution system, such as a furnace used for heating a residence or business. This air distribution system includes control circuitry, permitting the system to command the motor to turn on and off, and circuit arrangement 10 provides feedback to the controller indicating whether the motor is operating. The embodiment of the invention illustrated in FIG. 1 represents a two speed motor, but it should be understood that the invention can be adapted to any direct drive, multiple speed motor.

The circuit design consists of a resistor, diode, and photocoupler utilizing a light emitting diode (LED), all in series. The first of these circuits is connected between the speed windings of the motor and senses the voltage difference across the speed windings of the motor. This circuit provides feedback to the system as to whether the motor is operating. The second circuit is connected between the high speed motor winding and the power supply and senses the voltage between the high speed motor winding and the power line. This circuit provides feedback to the system as to which winding has been selected.

The circuit is designed such that when one of the circuits senses a voltage that is above a certain level, the LED will illuminate. This process will thus indicate to the system controller whether the motor is operating and whether the proper winding has been selected.

The voltage differences that result across the speed windings during the operation of a direct drive, multiple speed motor are fairly constant. Thus, the voltage sensing circuit design, unlike current sensing designs, may be used with furnaces that use different motors. Furthermore, the voltage sensing design is one which may be added while updating the original air distribution system. Unlike direct sensing designs, the air distribution system need not be designed particularly for voltage sensing. These qualities of the voltage sensing design make voltage sensing a highly compatible, efficient, and inexpensive method of providing feedback to the air distribution system controller.

The DDMS motor is designated generally by motor windings 13. The capability to operate at multiple speeds requires a motor to have multiple windings, which is generally accomplished by incorporating taps on the motor windings. On a two speed motor, there are necessarily three taps—low speed tap 14, high speed tap 16, and neutral tap 18—connected to the motor windings. High speed tap 16 divides motor winding 13 into two windings: motor winding 20, located between taps 14 and 16, and motor winding 22, located between taps 16 and 18. Motor winding 22 represents the high speed motor winding; motor winding 20 and motor winding 22 together represent the low speed motor winding. The selection of speed is accomplished by applying the supply voltage to the appropriate tap.

Inherent in this approach is that the motor acts like a transformer, i.e., if one winding is energized with the supply voltage, typically 110 volts applied across nodes 24 and 26, a scaled voltage will be induced across the other windings. This transformer action will take place only if the magnetic field configuration is normal, and this will be true only if the electric currents are normal, that is, within an expected range for the given circuit configuration. For example, a voltage can be applied to the high speed motor winding and if a sufficient current flows in that winding, an increased voltage, relative to neutral, can be detected across the low speed motor winding. Conversely, if the low speed motor winding is energized, a lower voltage, relative to neutral, will appear across the high speed motor winding. In any event the voltage relative to neutral is always higher on the low speed motor winding than it is on the high speed motor winding, effecting a voltage difference between the two motor windings when the motor is operating. Circuit arrangement 10 utilizes this induced voltage differential to verify the presence of sufficient currents to run the motor by sensing the voltage differential and providing feedback to the system controller confirming that the motor has started.

Blower enable switch 28 is the connection between the circuit arrangement and the air distribution system. The system controller commands the motor by opening and closing the blower enable switch. The system is able to control the speed of the motor by changing the position of speed select switch 30. When the switch is connected to low speed contact 15, the motor should run on low speed. When the switch is connected to high speed contact 17, the motor should run on high speed.

Light emitting diode (LED) and photocoupler pair 32, resistor 34, and diode 36 together provide the means for sensing the voltage difference across the low and high speed motor windings and indicating whether such voltage difference is above a predetermined threshold. In the embodiment illustrated in FIG. 1, resistor 34 is a 3900 ohm, 1 watt resistor. The supply signal 25 energizing circuit arrangement 10 is an alternating current (ac) signal. Since only the positive cycle of the signal is needed, Diode 36 is provided to restrict the voltage signal to its positive half cycle. The LED and photocoupler pair 32, in series with Diode 36, detects any voltage difference greater than 10 Volts, and when such a difference is detected, the LED illuminates.

When the motor is operating at low speed, the blower enable switch 28 is closed and the speed select switch 30 is connected to the low speed contact 15. The low speed tap will therefore be energized with the supply voltage, 110 Volts, and the transformer action will induce a voltage across the high speed motor winding of approximately 85 Volts. This difference in voltage across the low and high speed motor windings is detected by the LED and photocoupler, and the LED subsequently illuminates, indicating to the system controller that the motor is indeed operating.

When the motor is operating at high speed, the blower enable switch 28 is closed and the speed select switch 30 is connected to the high speed contact 17. The high speed tap will therefore be energized with the supply voltage, 110 Volts, and the transformer action will induce a voltage across the low speed motor winding. Since the voltage on the low speed motor winding is always greater than that on the high speed motor winding, the induced voltage across the low speed motor winding will be approximately 135 Volts. Again, the difference in voltage between the low and high speed motor windings is detected by the LED and photocoupler, and the LED will illuminate, indicating to the system controller that the motor is operating.

If the motor is not operating, the blower enable switch 28 is effectively open, and the speed select switch may be connected to either the low or high speed contact. Neither tap, however, will be energized with the supply voltage since the blower enable switch is open. Therefore, no voltage difference will appear across the low and high speed motor windings, and the LED and photocoupler will detect no voltage difference. In this situation, the LED will not illuminate, indicating to the system controller that the motor is not operating.

If there is a mechanical impediment to the motor operating, such as a locked rotor condition, current will initially flow through the circuit as if the motor were operating. Because the motor does not start, the electrical energy from supply 25 is not converted to mechanical energy and the motor windings will begin to overheat. When this occurs, thermal cutout 37 opens the circuit, eliminating the current flow and thus eliminating the voltages across the motor windings. For the short time until this occurs, circuit 10 will indicate that the motor is operating, but once thermal cutout 37 opens the circuit, the LED and photocoupler will sense that there is no voltage, and the LED will not illuminate, indicating that the motor is not operating.

Figure 2:
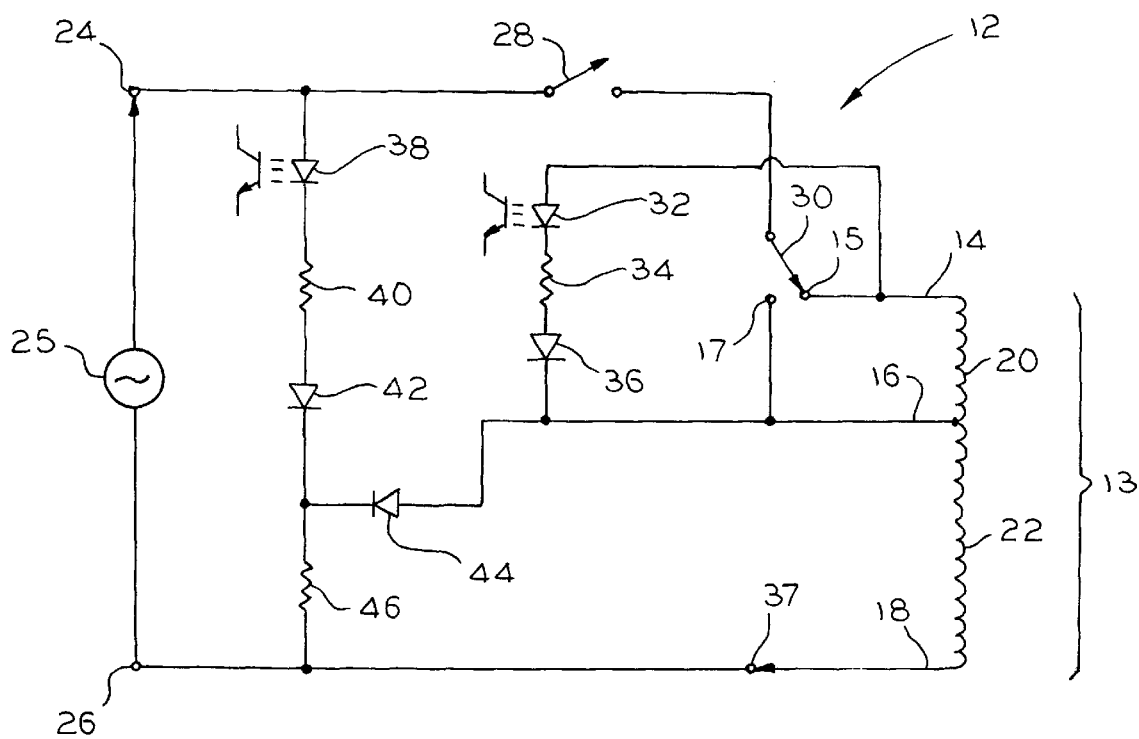
FIG. 2 is a schematic circuit diagram depicting another embodiment of the invention.

While FIG. 1 illustrates only the circuit that indicates whether the motor is operating, FIG. 2 illustrates a circuit arrangement 12 that indicates not only whether the motor is operating but also that the proper speed winding has been selected. The second task is useful, for example, in a dual-firing rate furnace system, which delivers two levels of gas flow rate to the burner. If the same mixture of gas and air is to be maintained, a dual speed inducer would be required, i.e., low fire requires a low speed inducer, and high fire requires a high speed inducer. Circuit arrangement 12 can be used to indicate whether the proper speed winding has been selected and whether the motor currents are approximately normal, that is, within the expected range, ensuring that the proper air-flow is obtained.

Circuit arrangement 12 is marked with the taps, motor windings, switches, nodes, and power supply identical to those in FIG. 1. The additional elements in this arrangement compare the line voltage to the high speed motor winding voltage in a manner similar to that with which circuit arrangement 10 compares the low speed motor winding voltage to the high speed motor winding voltage. Circuit arrangement 12 employs a photocoupler utilizing a light emitting diode (LED) 38, resistor 40, and diode 42 to provide the means for sensing the voltage difference between the supply and the high speed motor winding and indicating whether such voltage difference is above a predetermined voltage level. In the embodiment of the invention illustrated in FIG. 2, resistor 40 is a 3900 ohm, 1 watt resistor, and resistor 46 is a 15000 ohm, 2 watt resistor. Diodes 44 and 42, like diode 36, are used to restrict the voltage signal to its positive half cycle.

When the motor is operating at low speed, the blower enable switch 28 is closed and the speed select switch 30 is connected to the low speed contact 15. The low speed tap will therefore be energized with the supply voltage, 110 Volts, and the transformer action will induce a voltage across the high speed motor winding of approximately 85 Volts. In this situation, there is a voltage difference between the supply voltage, 110 Volts, and the voltage across the high speed motor winding, approximately 85 Volts. The LED and photocoupler pair 38 will detect this difference in voltage, and the LED will illuminate, indicating to the system controller that the low speed motor winding has been selected.

When the motor is operating at high speed, the blower enable switch 28 is closed, and the speed select switch 30 is connected to the high speed contact 17. The high speed tap 16 will therefore be energized with the supply voltage, 110 Volts, and the low speed winding will be energized with an induced voltage of approximately 135 Volts. In this situation, there is no voltage difference between the supply voltage, 110 Volts, and the voltage across the high speed motor winding, also 110 Volts. Therefore, the LED and photocoupler pair 38 will not detect a voltage difference, and the LED will not illuminate, indicating to the system controller that the high speed motor winding has been selected.

Circuit arrangement 12, therefore, performs both functions described above: the circuit indicates to the system controller first whether the motor is operating and second whether the correct speed winding has been selected. It will be understood that the foregoing description is one of preferred embodiment of the present invention and is not limited to the specific forms shown. Modifications may be made in the design and arrangement of elements within the scope of the present invention as expressed in the appended claims.

I claim:

1. A method for establishing the operating status of a direct drive, multiple speed motor, having at least first and second speed motor windings and a power supply for selectively applying a source voltage to the first and second speed motor windings for energizing said motor at different speeds, the method comprising the steps of:

(a) sensing a presence of an induced voltage between the first and second speed windings of the motor;

(b) sensing a presence of the source voltage on one of the first and second speed motor windings; and (c) providing an indication when the induced voltage is present and the source voltage is present for signifying motor operation.

2. The method of claim 1 further comprising the steps of:

comparing the induced voltage to a reference; and causing a second indicator to provide an indication when the induced voltage exceeds the reference for signifying motor operation at a first speed.

3. The method of claim 2 wherein the windings include at least first, second and third taps adapted to be connected in pairs across the power supply, the method comprising the steps of:

applying the source voltage across the first taps and second taps;

sensing the induced voltage between the second taps and third taps, and sensing the source difference between the first taps and second taps.

4. The method of claim 2 wherein the step of causing a second indicator to provide a second indication further comprises:

preventing the second indicator from providing the second indication when the induced voltage is below the reference for signifying that the second motor speed is selected.

5. A circuit for establishing the operating status of a direct drive, multiple speed motor, having at least first and second speed motor windings and a power supply for selectively applying a source voltage to the first and second speed motor windings for energizing said motor at different speeds, comprising:

(a) means for sensing a presence of an induced voltage between the first and second speed windings of the motor;

(b) means for sensing a presence of the source voltage one of the first and second speed motor winding; and (c) means for providing an indication when the induced voltage is present and the source voltage is present for signifying motor operation.

6. The circuit of claim 5 further comprising:

means for comparing the induced voltage to a reference; and means for causing a second indicator to provide an indication when the induced voltage exceeds the reference for signifying motor operation at a first speed.

7. The circuit of claim 6 wherein the windings include at least first, second and third taps adapted to be connected in pairs across the power supply, and the source voltage being applied across the first and second taps, the means for sensing the induced voltage comprising means for sensing an induced voltage across the second and third taps and the means for sensing the source voltage comprising means for sensing a source voltage across the first and second taps.

8. The method of claim 2 wherein the step of causing a second indicator to provide a second indication further comprises:

preventing the second indicator from providing the second indication when the induced voltage is below the reference for signifying that the second motor speed is selected.

\* \* \* \* \*